United States Patent
Iba

(10) Patent No.: US 7,196,003 B2
(45) Date of Patent: Mar. 27, 2007

(54) METHOD FOR MANUFACTURING A SEMICONDUCTOR DEVICE SUITABLE FOR THE FORMATION OF A WIRING LAYER

(75) Inventor: Yoshihisa Iba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 171 days.

(21) Appl. No.: 10/774,496

(22) Filed: Feb. 10, 2004

(65) Prior Publication Data

US 2004/0198037 A1     Oct. 7, 2004

(30) Foreign Application Priority Data

Mar. 18, 2003   (JP)   ............................. 2003-074381

(51) Int. Cl.
*H01L 21/4763*   (2006.01)
(52) U.S. Cl. .................. 438/622; 438/624; 438/627; 438/637; 438/717
(58) Field of Classification Search ................ 438/622
See application file for complete search history.

(56) References Cited

U.S. PATENT DOCUMENTS

2003/0119305 A1*   6/2003   Huang et al. ............... 438/633

FOREIGN PATENT DOCUMENTS

| JP | 2000-351976 | 12/2000 |
|---|---|---|
| JP | 2001-077196 | 3/2001 |
| JP | 2002-222860 | 8/2002 |

* cited by examiner

*Primary Examiner*—Jack Chen
(74) *Attorney, Agent, or Firm*—Westerman, Hattori, Daniels & Adrian, LLP.

(57) ABSTRACT

A four-layer structured hard mask composed of a SiC film, a first SiO₂ film, a SiC film, and a second SiO₂ film is formed on a porous silica film as an interlayer insulating film. Then, the second SiO₂ film is etched with a resist mask. Subsequently, the SiC film is etched with the second SiO₂ film. Thereafter, the first SiO₂ film is etched with the SiC film. Subsequently, the SiC film is etched with the SiC film. Then, by etching the porous silica film with the SiC film, a wiring trench is formed. At this time, a selection ratio between the SiC film and the porous silica film is large, so that deformation of the SiC film rarely occurs, which prevents leakage caused by the deformation.

10 Claims, 17 Drawing Sheets

METHOD FOR MANUFACTURING A SEMICONDUCTOR DEVICE SUITABLE FOR THE FORMATION OF A WIRING LAYER

CROSS-REFERENCE TO RELATED APPLICATIONS

This application is based upon and claims the benefit of priority from the prior Japanese Patent Application No. 2003-074381, filed on Mar. 18, 2003, the entire contents of which are incorporated herein by reference.

BACKGROUND OF THE INVENTION

1. Field of the Invention

The present invention relates to a method for manufacturing a semiconductor device suitable for the formation of a wiring layer.

2. Description of the Related Art

Recently, with a request for miniaturization, a damascene method is often adopted in manufacturing a semiconductor device. Moreover, in the damascene method, in terms of CMP (Chemical Mechanical Polishing) of a wiring material and photolithography technology, three-layer structured hard mask is sometimes used when a via hole and a wiring trench are formed in an interlayer insulating film. This is for the following reason.

FIG. 4A to FIG. 4C are sectional views showing the progress of CMP in the damascene method step by step. When a porous silica film 114 as an interlayer insulating film is formed and a wiring trench is formed in this porous silica film 114, an insulating film 115 which prevents the porous silica film 114 from being polished and an insulating film 116 as a polishing allowance in CMP are needed. In order to perform CMP with high precision, that is, in order to enable the thickness of each film to be a designed value, the insulating film 115 is required to have high hardness, and the insulating film 116 is required to be polished by CMP more easily than the insulating film 115. Hence, a SiC film, a SiN film, a SiOC film with high hardness, or the like is used as the insulating film 115, and an $SiO_2$ film or the like is used as the insulating film 116. By using these films, when CMP is performed as shown in FIG. 4B after a Cu film 117 is embedded in the wiring trench as shown in FIG. 4A, the CMP is stopped at the surface of the insulating film 115 as shown in FIG. 4C.

When the $SiO_2$ film is used as the insulating film 116, a selection ratio between the insulating film 116 and the porous silica film is low. Therefore, the insulating film 116 needs to be relatively thick. However, in the case of such a two-layer structured hard mask as shown in FIG. 4A to FIG. 4C, it is impossible to thicken the insulating film 116. This is for the following reason.

FIG. 5A and FIG. 5B are sectional views showing the progress of etching with an ArF resist step by step. For example, as shown in FIG. 5A, an antireflection film 120 such as an BARC (Bottom Anti-Reflection Coating) is formed on a film to be processed 119 such as the insulating film 116, and a resist mask 121 made of the ArF resist is formed on the antireflection film 120. Then, the antireflection film 120 and the film to be processed 119 are etched with the resist mask 121 as a mask. Since the ArF resist has low resistance to etching at this time and thereby the resist mask 121 becomes thinner, the processable depth of the film to be processed 119 is shallow. Further, recently, with a request for miniaturization, it becomes necessary to reduce the thickness of the resist mask 121 in order to improve resolution. Hence, the depth of the film to be processed 119 which can be processed with the resist mask 121 becomes shallower.

In these circumstances, it is impossible to thicken the insulating film 116 in the case of the two-layer structured hard mask. Hence, a three-layer structured hard mask is used by further forming a thin hard mask on the insulating film 116.

Prior arts are disclosed in Japanese Patent Laid-open No. 2000-351976, Japanese Patent Laid-open No. 2001-77196, and Japanese Patent Laid-open No. 2002-222860.

However, it has become difficult to cope with further miniaturization even if the three-layer structured hard mask is used. FIG. 6A to FIG. 6D are sectional views showing a method for manufacturing a semiconductor device, which adopts a conventional damascene method, step by step.

In the conventional manufacturing method, as shown in FIG. 6A, a SiC film 103, a porous silica film 104, a SiC film 105, a $SiO_2$ film 106, a SiN film 107, and an antireflection film 109 such as an BARC are formed in sequence on a Cu wiring 102, and thereafter a resist mask 110 made of an ArF resist is formed.

Then, as shown in FIG. 6B, the antireflection film 109 and the SiN film 107 are etched with the resist mask 110 as a mask. Subsequently, the resist mask 110 is removed by ashing.

Thereafter, as shown in FIG. 6C, the $SiO_2$ film 106 is etched with the SiN film 107 as a mask. Then, the SiC film 105 is etched with the $SiO_2$ film 106 as a mask, and simultaneously the SiN film 107 is removed.

Subsequently, as shown in FIG. 6D, the porous silica film 104 and the SiC film 103 are etched with the $SiO_2$ film 106 as a mask. Thereafter, a wiring is formed.

In the aforementioned conventional manufacturing method, as shown in FIG. 6D, a selection ratio between the $SiO_2$ film 106 and the inorganic porous silica film 104 is low, whereby an end portion of the $SiO_2$ film 106 used as the hard mask is rounded off. As a result, the size of an opening becomes larger than a designed value, which easily causes leakage between adjacent wirings.

To avoid the aforementioned drawback, it is conceivable to thicken the $SiO_2$ film 106, but to thicken the $SiO_2$ film 106, it is also necessary to thicken the SiN film 107 used as a hard mask when the $SiO_2$ film 106 is patterned, which causes a problem regarding photolithography.

If the SiN film 107 is thickened, the following problem arises. FIG. 7A to FIG. 7C are sectional views showing a method for forming a resist mask by a dual damascene method step by step.

In a trench-first exposure type dual damascene method, as shown in FIG. 7A, a hard mask 123 on which a wiring trench pattern is formed is formed on a film to be processed 122, and thereafter, as shown in FIG. 7B, a resist mask 124 made of an ArF resist is formed on the entire surface. At this time, the resist mask 124 in a portion on which a wide wiring trench pattern is formed is thinner than that in other portions. Then, when a via hole pattern is formed on the resist mask 124 by exposure and developing as shown in FIG. 7C, the size of the via hole becomes larger than a designed value in the portion where the resist mask 124 is thinner.

Moreover, as described above, to improve the resolution, it is necessary to reduce the thickness of the resist mask, whereby the top-layer hard mask needs to be thin.

SUMMARY OF THE INVENTION

The present invention is made in view of the aforementioned problem and its object is to provide a method for manufacturing a semiconductor device capable of preventing leakage between wirings caused by miniaturization.

As a result of assiduous studies, the inventor of the present invention has reached various aspects of the invention described below.

A method for manufacturing a semiconductor device according to the present invention aims at a method for manufacturing a semiconductor device having the step of forming a wiring by a damascene method. In this manufacturing method, an etching stopper film and an interlayer insulating film are formed in sequence over a conductive layer. Then, a silicon carbide film, a silicon nitride film, or a silicon oxynitride film is formed as a first hard mask over the interlayer insulating film. Subsequently, a silicon oxide film is formed as a second hard mask over the first hard mask. Thereafter, a silicon carbide film or a silicon nitride film is formed as a third hard mask over the second hard mask. Then, a silicon oxide film is formed as a fourth hard mask over the third hard mask. Subsequently, a pattern is formed over the fourth hard mask. Thereafter, the third hard mask is etched with the fourth hard mask. Then, the second hard mask is etched with the third hard mask. Subsequently, the first hard mask is etched with the third hard mask. Then, an opening which reaches the etching stopper film is formed in the interlayer insulating film by etching the interlayer insulating film with the third hard mask. Thereafter, a portion of the etching stopper film which is exposed from the opening formed in the interlayer insulating film is etched. Subsequently, a wiring material is embedded in the opening.

DETAILED DESCRIPTION OF THE PREFERRED EMBODIMENTS

A method for manufacturing a semiconductor device according to each of embodiments of the present invention will be concretely described below with reference to the attached drawings.

First Embodiment

First, the first embodiment of the present invention will be described. FIG. 1A to FIG. 1J are sectional views showing a method for manufacturing a semiconductor device according to the first embodiment of the present invention step by step. In this embodiment, the semiconductor device is manufactured by a single damascene method.

Figure 1B:
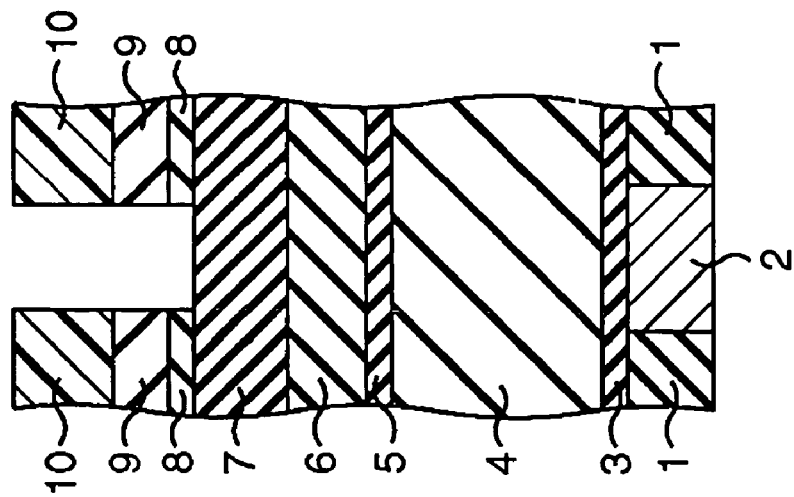
FIG. 1A to FIG. 1J are sectional views showing a method for manufacturing a semiconductor device according to a first embodiment of the present invention step by step.
Figure 1A:
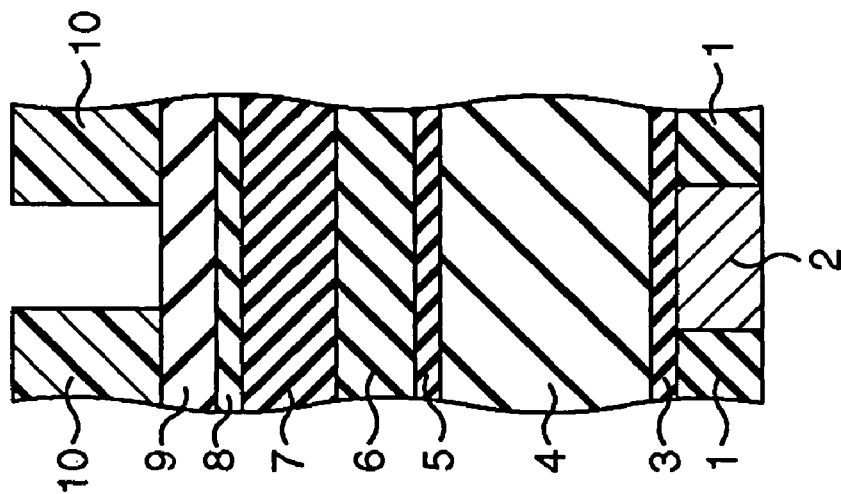

First, as shown in FIG. 1A, a SiC film 3 as an etching stopper film is formed on a Cu wiring 2 (conductive layer) formed in an interlayer insulating film 1. The thickness of the SiC film 3 is, for example, 30 nm. Then, a porous silica film 4 as an interlayer insulating film is formed on the SiC film 3. The thickness of the porous silica film 4 is, for example, 200 nm. The porous silica film 4 is a porous low dielectric constant insulating film.

Subsequently, a SiC film 5 as a first hard mask is formed on the porous silica film 4, and then a $SiO_2$ film 6 as a second hard mask is formed. The thicknesses of the SiC film 5 and the $SiO_2$ film 6 are, for example, 40 nm and 70 nm, respectively. Thereafter, a SiC film 7 as a third hard mask is formed on the $SiO_2$ film 6, and then a $SiO_2$ film 8 as a fourth hard mask is formed. Preferably, the thickness of the SiC film 7 is more than twice that of the SiC film 5, and the SiC film 7 and the $SiO_2$ film are, for example, 80 nm and 50 nm respectively in thickness. Thereafter, an antireflection film 9 which is necessary for patterning is formed on the $SiO_2$ film 8. The antireflection film 9 is, for example, an organic BARC. Then, an organic ArF photoresist is applied on the antireflection film 9, and then exposed and developed to form a resist mask 10 on which a wiring trench pattern is formed. The wiring trench width is, for example, approximately 100 nm.

Thereafter, as shown in FIG. 1B, the antireflection film 9 is etched with the resist mask 10 as a mask. In this etching, gas, for example, containing $CF_4$ and Ar is used. More specifically, this etching is performed using a plasma etching device, for example, under the condition of 50 sccm of $CF_4$, 20 sccm of Ar, 6.67 Pa (50 mTorr) of pressure, and 300 W of RF source power.

Subsequently, the $SiO_2$ film 8 is etched with the resist mask 10 as a mask. In this etching, gas, for example, containing $C_4F_6$ is used and the power is relatively high. More specifically, this etching is performed using the plasma etching device, for example, under the condition of 30 sccm of $C_4F_6$, 15 sccm of $O_2$, 300 sccm of Ar, 4.00 Pa (30 mTorr) of pressure, and 1000 W of RF source power. As a result, the $SiO_2$ film 8 is patterned in the wiring trench pattern.

Figure 1D:
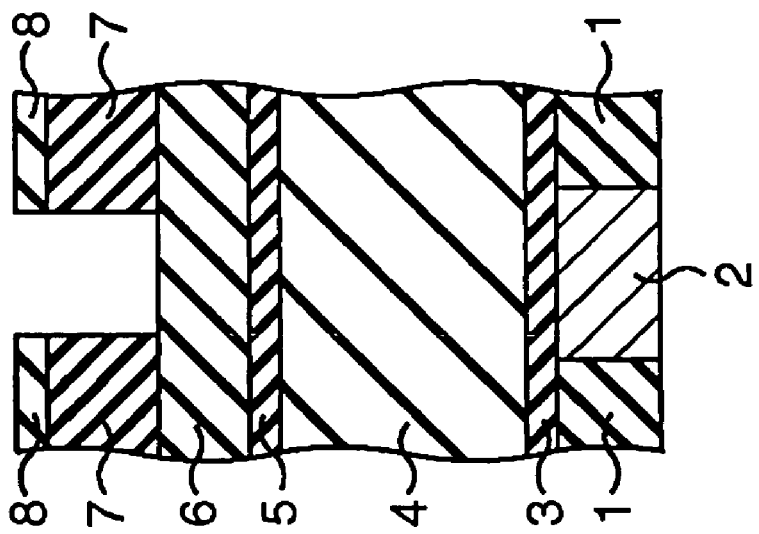
Figure 1C:
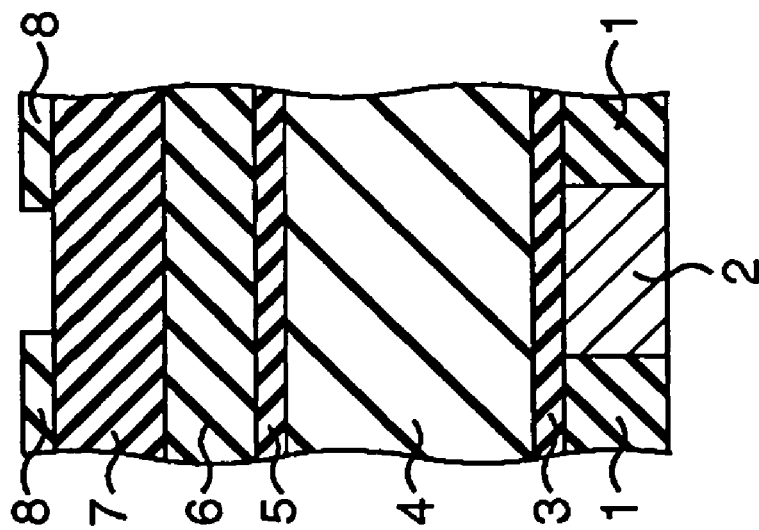

Then, as shown in FIG. 1C, the resist mask 10 and the antireflection film 9 are removed by ashing.

Thereafter, as shown in FIG. 1D, the SiC film 7 is etched with the $SiO_2$ film 8 as a mask. In this etching, in order to raise the selection ratio between the $SiO_2$ films 6 and 8 and the SiC film 7, gas, for example, containing $CHF_3$, $CH_2F_2$, or $CH_3F$ and further containing $N_2$, $O_2$, and Ar is used, and the power is low. More specifically, this etching is performed using the plasma etching device, for example, under the condition of 30 sccm of $CH_2F_2$, 20 sccm of $O_2$, 50 sccm of Ar, 50 sccm of $N_2$, 2.67 Pa (20 mTorr) of pressure, and 200 W of RF source power.

Figure 1F:
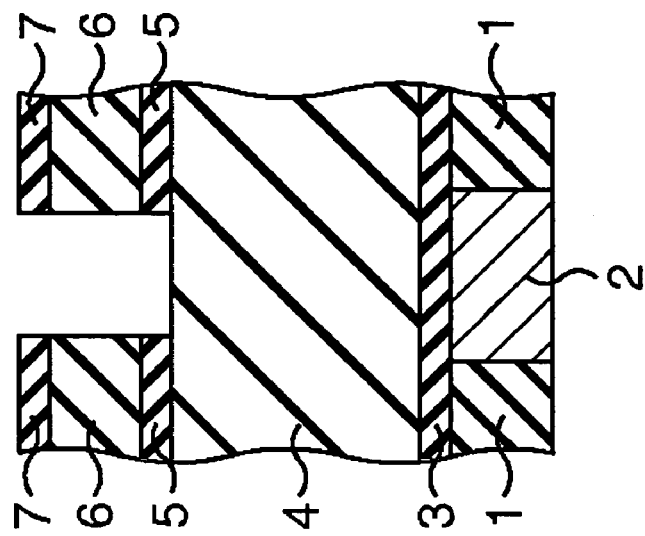
Figure 1E:
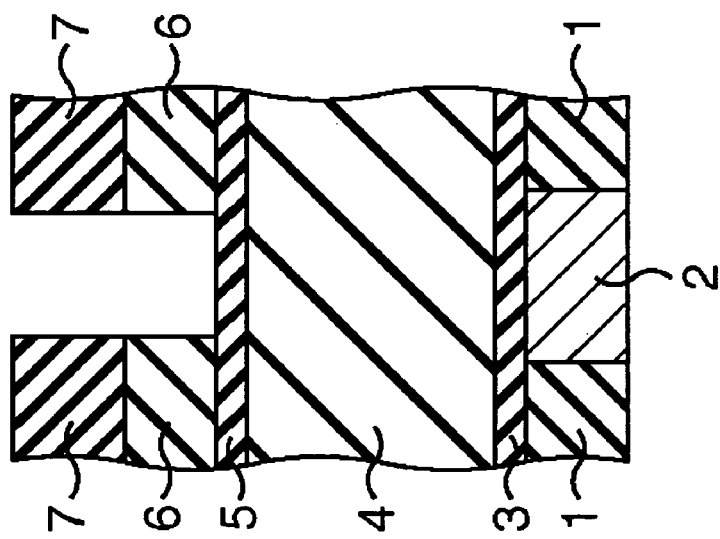

Subsequently, as shown in FIG. 1E, the $SiO_2$ film 6 is etched with the SiC film 7 as a mask, and simultaneously the $SiO_2$ film 8 is removed. In this etching, in order to raise the selection ratio between the $SiO_2$ films 6 and 8 and the SiC films 5 and 7, gas, for example, containing $C_4F_6$, $C_4F_8$, $C_5F_8$, $CHF_3$, or $CH_2F_2$ and further containing $O_2$ and Ar is used, and the power is high. More specifically, this etching is performed using the plasma etching device, for example, under the condition of 20 sccm of $C_4F_6$, 15 sccm of $O_2$, 200 sccm of Ar, 4.00 Pa (30 mTorr) of pressure, and 1500 W of RF source power.

Thereafter, as shown in FIG. 1F, the SiC film 5 is etched with the SiC film 7 as a mask. As a result, an exposed portion of the SiC film 5 is removed, and the SiC film 7 is thinned. In this etching, gas, for example, containing $CHF_3$, $CH_2F_2$, or $CH_3F$ and further containing $N_2$, $O_2$, and Ar is used, and the power is low. More specifically, this etching is performed using the plasma etching device, for example, under the condition of 30 sccm of $CH_2F_2$, 20 sccm of $O_2$, 50 sccm of Ar, 50 sccm of $N_2$, 2.67 Pa (20 mTorr) of pressure, and 200 W of RF source power.

Figure 1H:
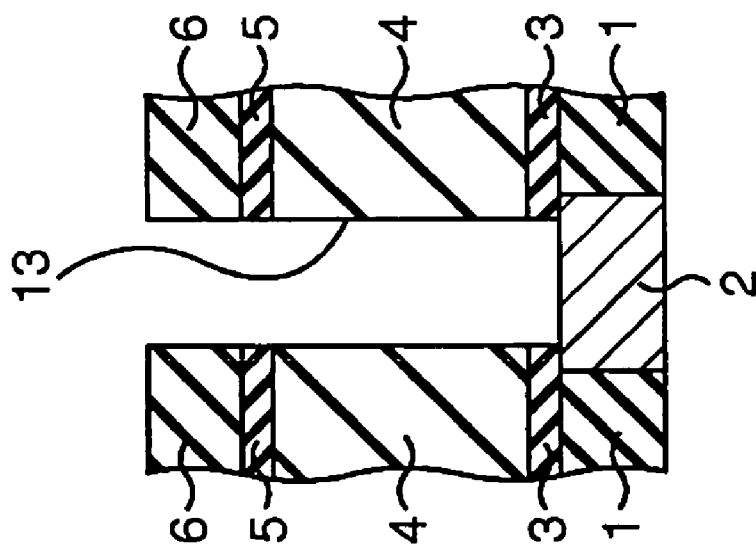
Figure 1G:
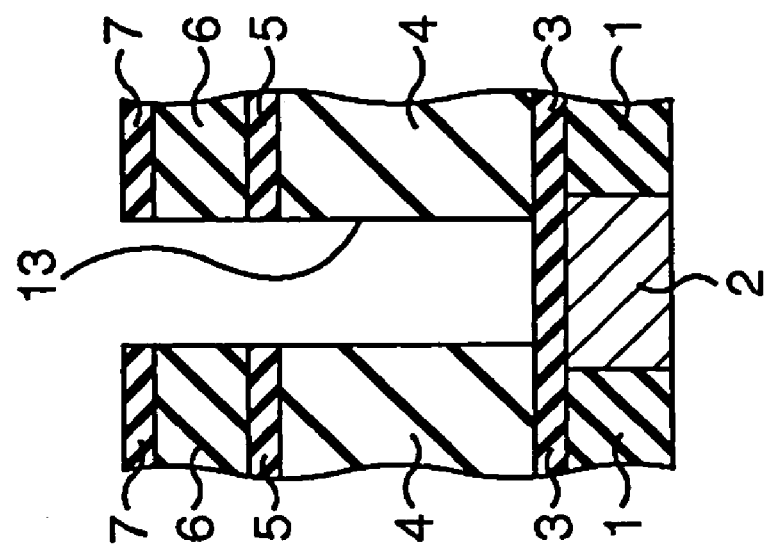

Then, as shown in FIG. 1G, the porous silica film 4 is etched with the SiC film 7 as a mask. Because of the etching, surface roughness tends to occur to the porous silica film, and the porous silica film tends to have a sub-trench shape. Therefore, in this etching, gas, for example, containing $CF_4$ is used, and the pressure is high (for example, 6.67 Pa to 40.0 Pa (50 Torr to 300 mTorr)). To prevent side etching, $CHF_3$, $C_4F_6$, $C_5F_8$, or $C_4F_8$ is further mixed. More specifically, this etching is performed using the plasma etching device, for example, under the condition of 50 sccm of $CF_4$, 100 sccm of $CHF_3$, 50 sccm of Ar, 10 sccm of $N_2$, 26.7 Pa (200 mTorr) of pressure, and 1000 W of RF source power. As a result of this etching, a wiring trench 13 is formed in the porous silica film 4.

Thereafter, as shown in FIG. 1H, an exposed portion of the SiC film 3 and the SiC film 7 are removed by etching. In this etching, gas, for example, containing $CHF_3$, $CH_2F_2$, or $CH_3F$ and further containing $N_2$, $O_2$, and Ar is used, and the power is low. More specifically, this etching is performed using the plasma etching device, for example, under the condition of 30 sccm of $CH_2F_2$, 15 sccm of $O_2$, 50 sccm of Ar, 75 sccm of $N_2$, 2.67 Pa (20 mTorr) of pressure, and 150 W of RF source power. As a result of this etching, the wiring trench 13 reaches the lower Cu wiring 2.

Figure 1J:
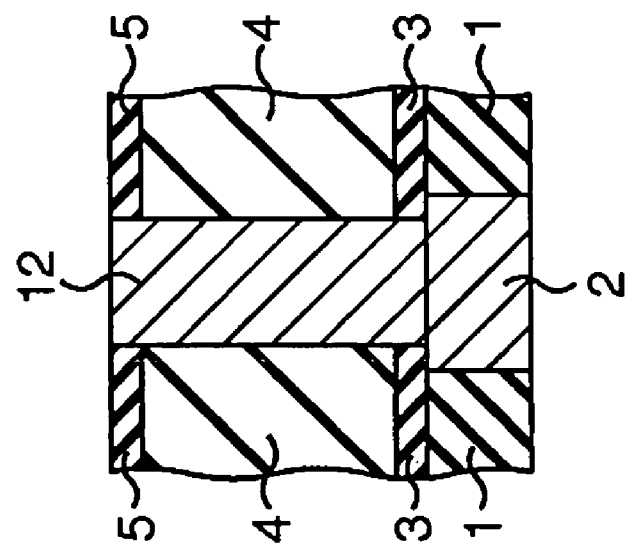
Figure 1I:
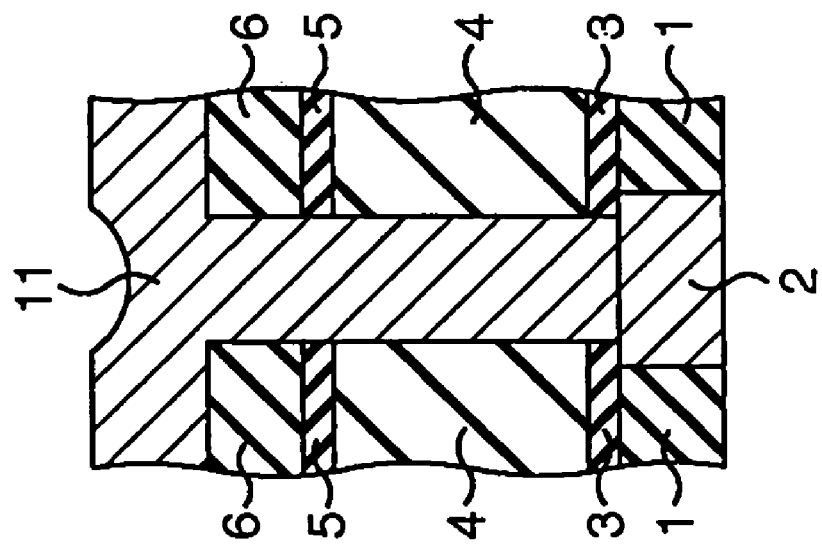

Subsequently, as shown in FIG. 1I, a Cu film (wiring material) 11 is embedded in the wiring trench 13, and as shown in FIG. 1J, by subjecting the Cu film 11 to CMP (Chemical Mechanical Polishing), a Cu wiring 12 is formed. Thereafter, an interlayer insulating film, a wiring, and the like are formed as required to complete the semiconductor device.

According to the aforementioned first embodiment, a hard mask is four-layer structured, and when the porous silica film 4 is etched, the SiC film 7, whose selection ratio to the porous silica film 4 is high, is used as a mask. Therefore, deformation of the hard mask rarely occurs, which can prevent leakage caused by the deformation.

Second Embodiment

Figure 2A:
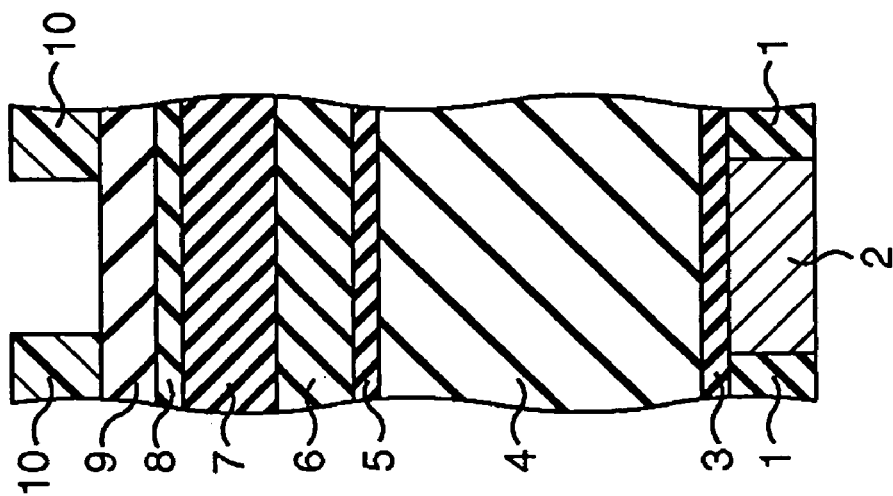
FIG. 2A to FIG. 2N are sectional views showing a method for manufacturing a semiconductor device according to a second embodiment of the present invention step by step.

Next, the second embodiment of the present invention will be described. FIG. 2A to FIG. 2N are sectional views showing a method for manufacturing a semiconductor device according to the second embodiment of the present invention step by step. In this embodiment, the semiconductor device is manufactured by a trench-first exposure type dual damascene method.

First, as shown in FIG. 2A, a SiC film 3 as an etching stopper film is formed on a Cu wiring 2 (conductive layer) formed in an interlayer insulating film 1. The thickness of the SiC film 3 is, for example, 30 nm. Then, a porous silica film 4 as an interlayer insulating film is formed on the SiC film 3. The thickness of the porous silica film 4 is, for example, 400 nm.

Subsequently, a SiC film 5 as a first hard mask is formed on the porous silica film 4, and then a $SiO_2$ film 6 as a second hard mask is formed. The thicknesses of the SiC film 5 and the $SiO_2$ film 6 are, for example, 40 nm and 70 nm, respectively. Thereafter, a SiC film 7 as a third hard mask is formed on the $SiO_2$ film 6, and then a $SiO_2$ film 8 as a fourth hard mask is formed. Preferably, the thickness of the SiC film 7 is more than twice that of the SiC film 5, and hence the SiC film 7 and the $SiO_2$ film 8 are, for example, 80 nm and 50 nm respectively in thickness. Thereafter, an antireflection film 9 which is necessary for patterning is formed on the $SiO_2$ film 8. The antireflection film 9 is, for example, an organic BARC. Then, an organic ArF photoresist is applied on the antireflection film 9, and then exposed and developed to form a resist mask 10 on which a wiring trench pattern is formed.

Figure 2B:
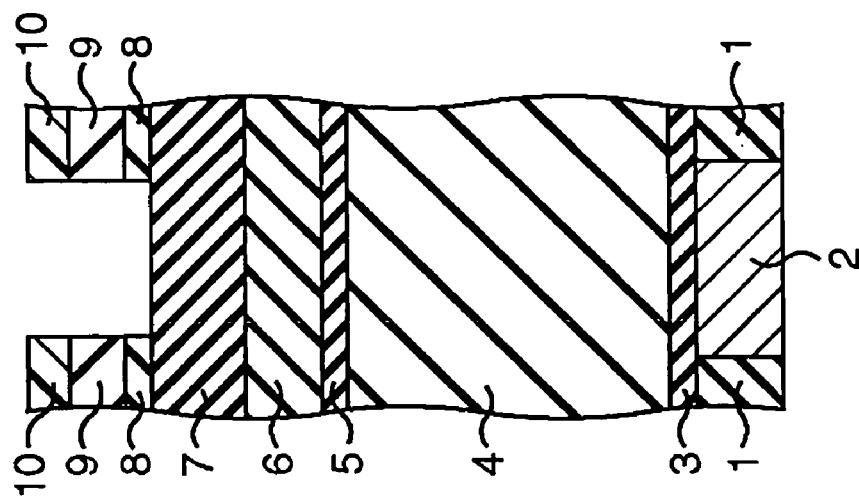
Figure 2D:
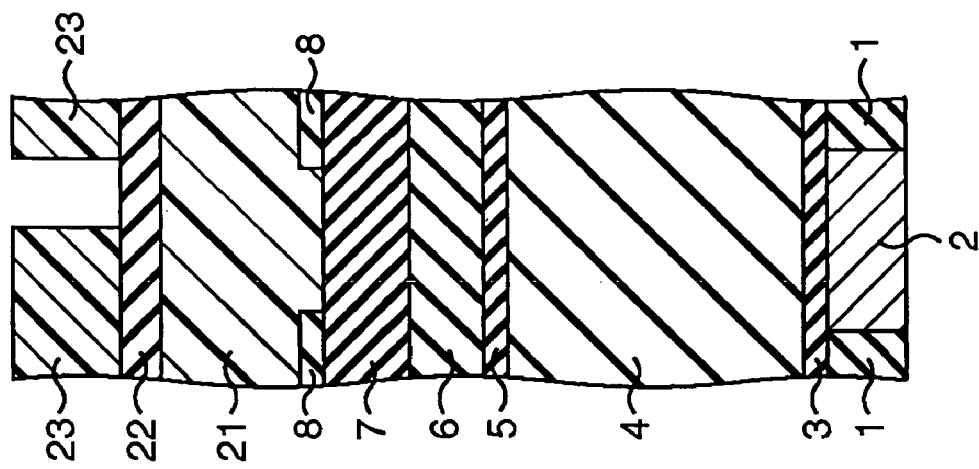

Thereafter, as shown in FIG. 2B, the antireflection film 9 is etched with the resist mask 10 as a mask. In this etching, gas, for example, containing $CF_4$ and Ar is used. More specifically, this etching is performed using a plasma etching device, for example, under the condition of 50 sccm of $CF_4$, 20 sccm of Ar, 6.67 Pa (50 mTorr) of pressure, and 300 W of RF source power.

Subsequently, the $SiO_2$ film 8 is etched with the resist mask 10 as a mask. In this etching, gas, for example, containing $C_4F_6$ is used, and the power is relatively high. More specifically, this etching is performed using the plasma etching device, for example, under the condition of 30 sccm of $C_4F_6$, 15 sccm of $O_2$, 300 sccm of Ar, 4.00 Pa (30 mTorr) of pressure, and 1000 W of RF source power. As a result, a wiring trench pattern (first pattern) is formed on the $SiO_2$ film 8.

Figure 2C:
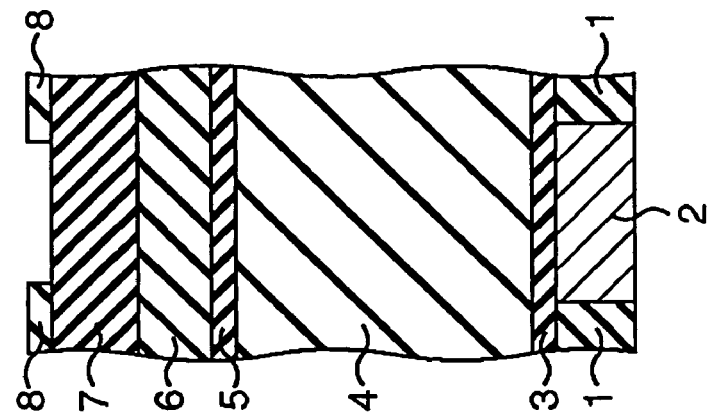

Then, as shown in FIG. 2C, the resist mask 10 and the antireflection film 9 are removed by ashing.

Thereafter, a via hole pattern is formed on the porous silica film 4 as the interlayer insulating film. Here, tri-level technology is used for the wiring trench pattern formed on the $SiO_2$ film 8.

More specifically, first, as shown in FIG. 2D, a lower resin film (organic film) 21 for making up the level difference of the $SiO_2$ film 8 to planarize the $SiO_2$ film 8 is formed. Then, an SOG (Spin On Glass) film (inorganic film) 22 to be used as a mask-when the lower resin film 21 is etched is formed on the lower resin film 21. Subsequently, an organic ArF photoresist is applied on the SOG film 22, and then exposed and developed to thereby form a resist mask (photoresist film) 23 on which a via hole pattern is formed. The diameter of a via hole is, for example, approximately 100 nm.

Figure 2E:
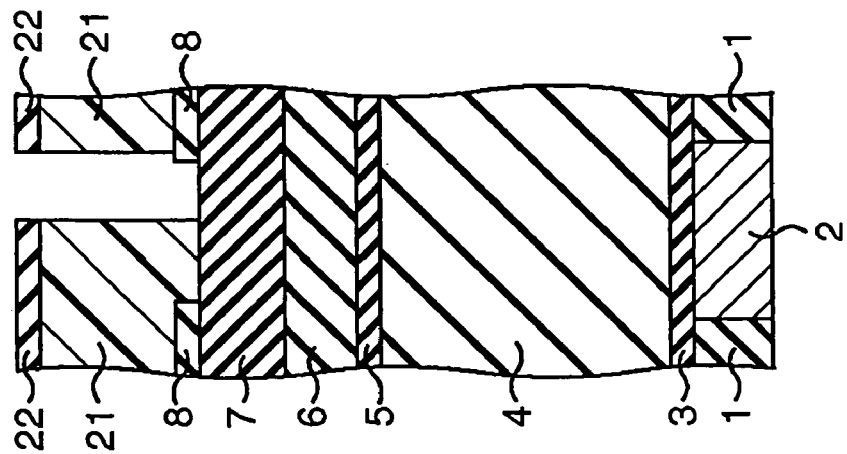

Thereafter, as shown in FIG. 2E, the SOG film 22 is etched with the resist mask 23 as a mask. Then, the lower resin film 21 is etched with the SOG film 22 as a mask, and at the same time, the resist mask 23 is removed.

Figure 2F:
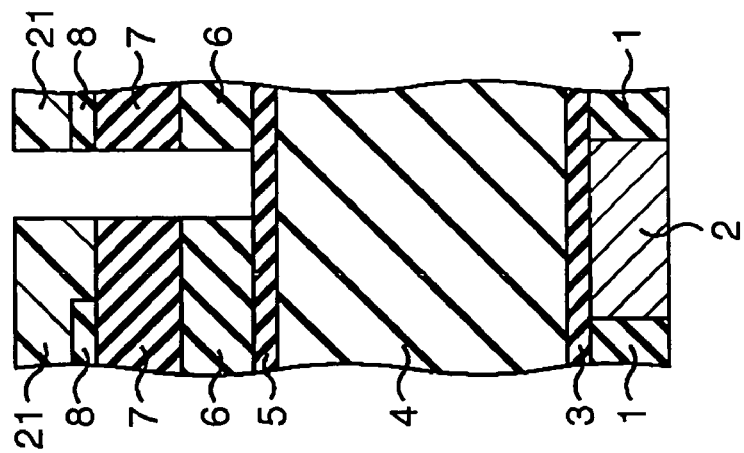
Figure 2H:
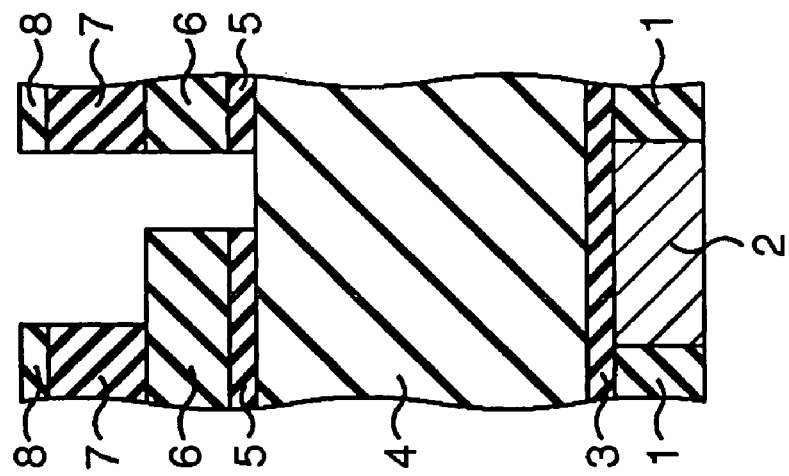

Subsequently, as shown in FIG. 2F, by etching the $SiO_2$ film 8, the SiC film 7, and the $SiO_2$ film 6 with the lower resin film 21 as a mask, the via hole pattern (second pattern) is formed on these films.

The etching of the $SiO_2$ film 8 is performed using the plasma etching device, for example, under the condition of 30 sccm of $C_4F_6$, 15 sccm of $O_2$, 300 sccm of Ar, 4.00 Pa (30 mTorr) of pressure, and 1000 W of RF source power.

The etching of the SiC film 7 is performed using the plasma etching device, for example, under the condition of 30 sccm of $CH_2F_2$, 20 sccm of $O_2$, 50 sccm of Ar, 50 sccm of $N_2$, 2.67 Pa (20 mTorr) of pressure, and 200 W of RF source power.

The etching of SiC film 5 is performed using the plasma etching device, for example, under the condition of 30 sccm of $CH_2F_2$, 20 sccm of $O_2$, 50 sccm of Ar, 50 sccm of $N_2$, 2.67 Pa (20 mTorr) of pressure, and 200 W of RF source power.

The etching of SiC film 5 is performed using the plasma etching device, for example, under the condition of 30 sccm of $CH_2F_2$, 20 sccm of $O_2$, 50 sccm of Ar, 50 sccm of $N_2$, 2.67 Pa (20 mTorr) of pressure, and 200 W of RF source power.

As a result of these series of etching, the via hole pattern (second pattern) is formed on the SiC film 7, and the $SiO_2$ film 6.

Figure 2G:
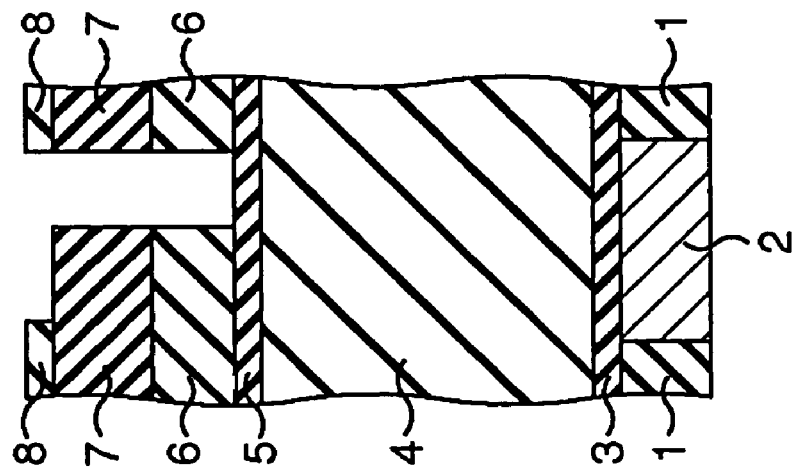
Figure 2J:
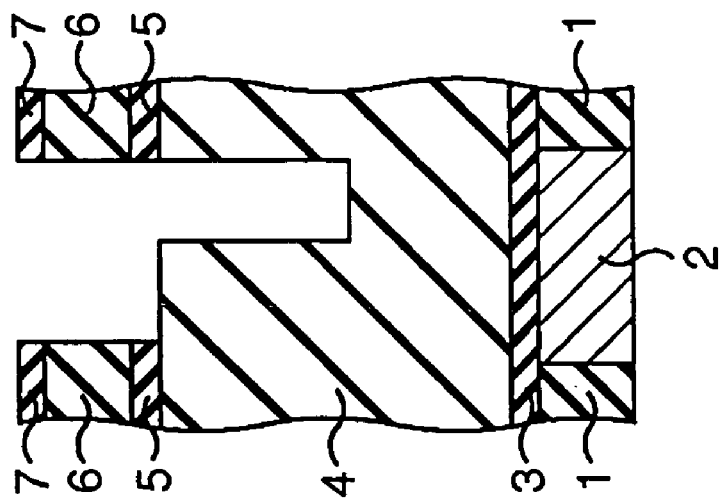

Then, as shown in FIG. 2G, the lower resin film 21 is removed by ashing.

Subsequently, as shown in FIG. 2H, the SiC films 7 and 5 are etched with the $SiO_2$ films 8 and 6 as a mask. This etching is performed using the plasma etching device, for example, under the condition of 30 sccm of $CH_2F_2$, 20 sccm of $O_2$, 50 sccm of Ar, 50 sccm of $N_2$, 2.67 Pa (20 mTorr) of pressure, and 200 W of RF source power. Consequently, the wiring trench pattern is formed on the SiC film 7, and the via hole pattern is formed on the SiC film 5.

Figure 2I:
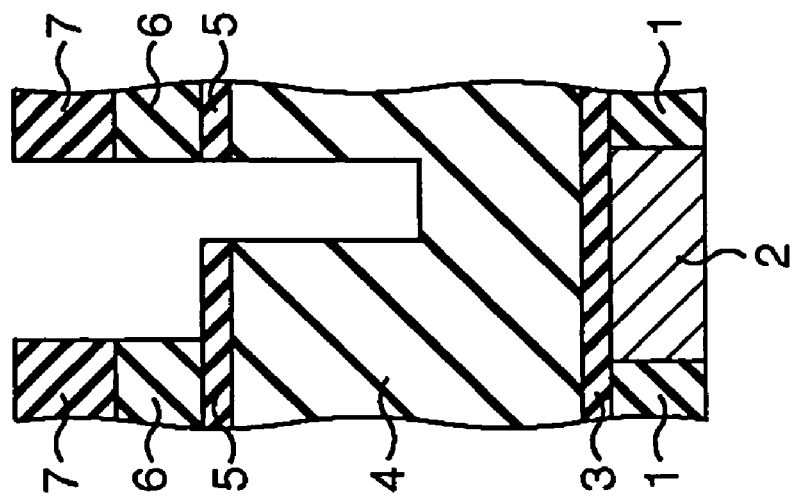

Thereafter, as shown in FIG. 2I, the $SiO_2$ film 6 is etched with the SiC film 7 as a mask, the porous silica film 4 is etched with the SiC film 5 as a mask, and simultaneously the $SiO_2$ film 8 is removed. This etching is performed using the plasma etching device, for example, under the condition of 50 sccm of $CF_4$, 100 sccm of $CHF_3$, 50 sccm of Ar, 10 sccm of $N_2$, 26.7 Pa (200 mTorr) of pressure, and 1000 W of RF source power. A hole formed in the porous silica film 4 by this etching becomes a part of the via hole. Moreover, the wiring trench pattern is formed on the $SiO_2$ film 6.

Subsequently, as shown in FIG. 2J, an exposed portion of the SiC film 5 is removed by etching, and at the same time, the SiC film 7 is thinned. This etching is performed using the plasma etching device, for example, under the condition of 30 sccm of $CH_2F_2$, 15 sccm of $O_2$, 50 sccm of Ar, 75 sccm of $N_2$, 2.67 Pa (20 mTorr) of pressure, and 150 W of RF source power. As a result, the wiring trench pattern is formed on the SiC film 5.

Figure 2K:
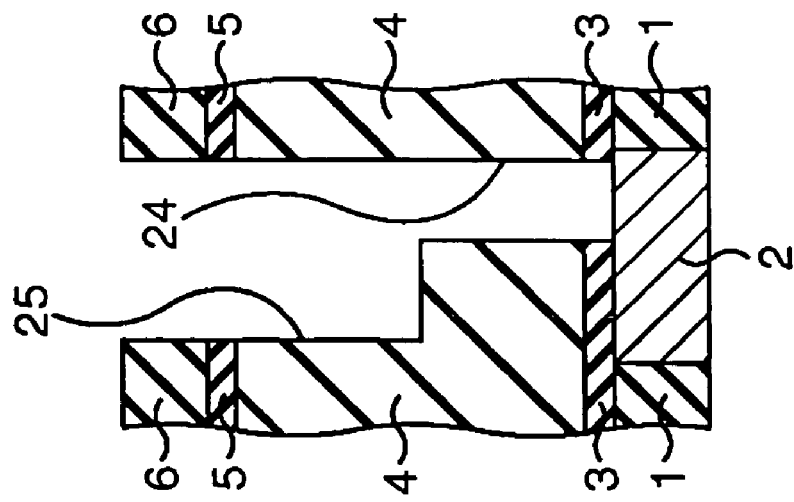

Then, by etching the porous silica film 4 with the SiC film 7 as a mask, as shown in FIG. 2K, a wiring trench 25 is formed, and simultaneously a via hole 24 which reaches the SiC film 3 is formed. This etching is performed using the plasma etching device, for example, under the condition of 50 sccm of $CF_4$, 100 sccm of $CHF_3$, 50 sccm of Ar, 10 sccm of $N_2$, 26.7 Pa (200 mTorr) of pressure, and 1000 W of RF source power.

Figure 2L:
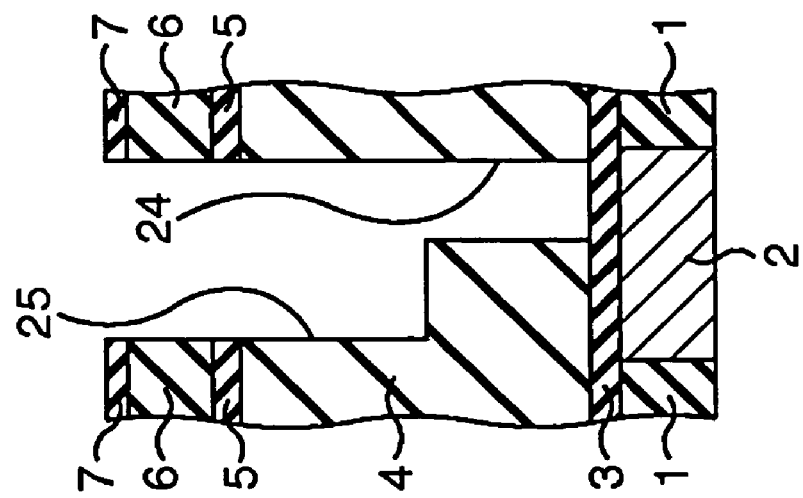
Figure 2N:
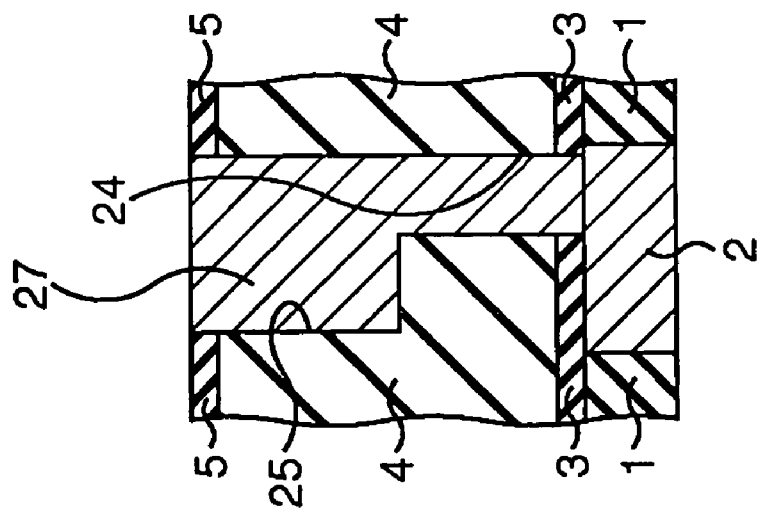

Subsequently, as shown in FIG. 2L, an exposed portion of the SiC film 3 and the SiC film 7 are removed by etching. This etching is performed using the plasma etching device, for example, under the condition of 30 sccm of $CH_2F_2$, 15 sccm of $O_2$, 50 sccm of Ar, 75 sccm of $N_2$, 2.67 Pa (20 mTorr) of pressure, and 150 W of RF source power. As a result of this etching, the via hole 24 gets to the lower Cu wiring 2.

Figure 2M:
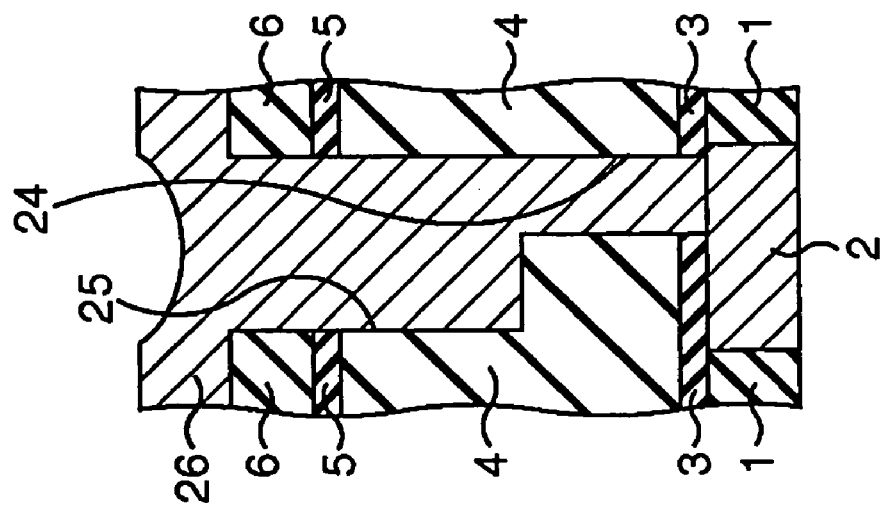

Thereafter, as shown in FIG. 2M, a Cu film (wiring material) 26 is embedded in the wiring trench 25 and the via hole 24, and as shown in FIG. 2N, by subjecting the Cu film 26 to CMP, a Cu wiring 27 is formed. Thereafter, an interlayer insulating film, a wiring, and the like are formed as required to complete the semiconductor device.

Figure 3:
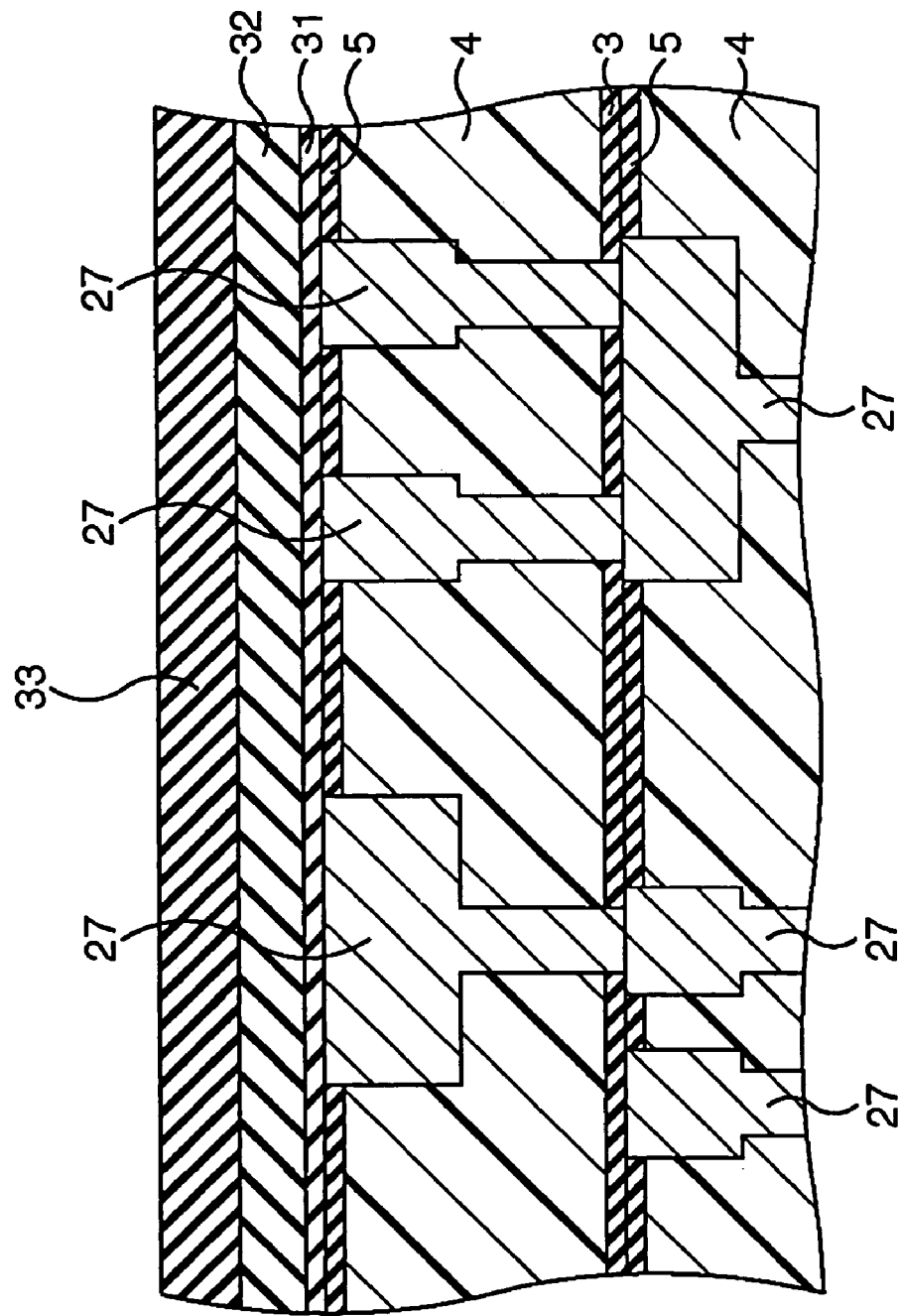
FIG. 3 is a sectional view showing the structure of the semiconductor device manufactured by applying the second embodiment thereto.
Figure 4A:
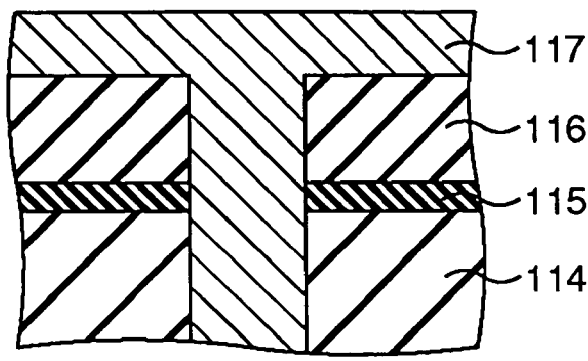
FIG. 4A to FIG. 4C are sectional views showing the progress of CMP in a damascene method step by step.
Figure 4B:
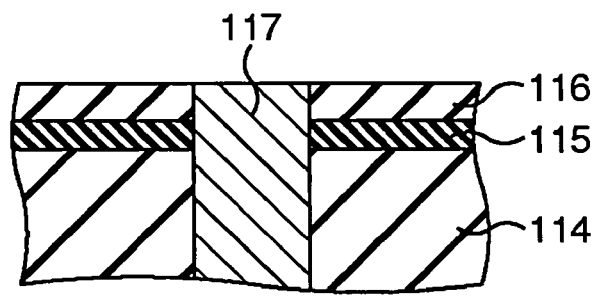
Figure 4C:
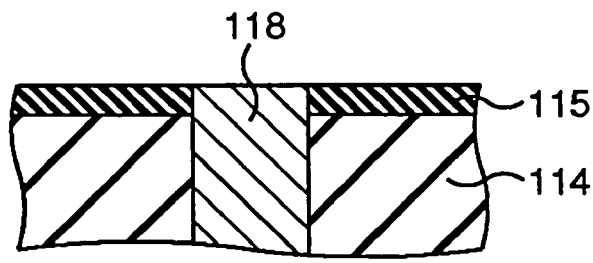
Figure 5A:
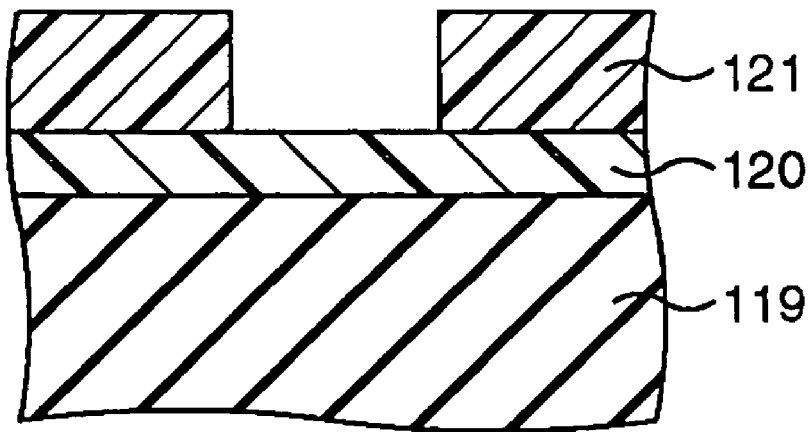
FIG. 5A and FIG. 5B are sectional views showing the progress of etching with an ArF resist step by step.
Figure 5B:
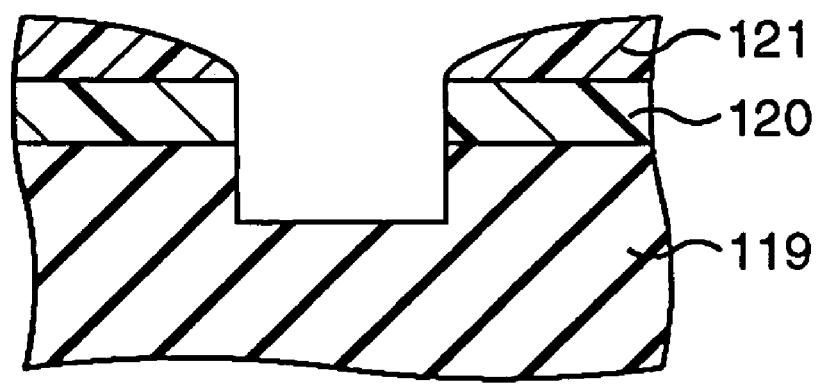
Figure 6A:
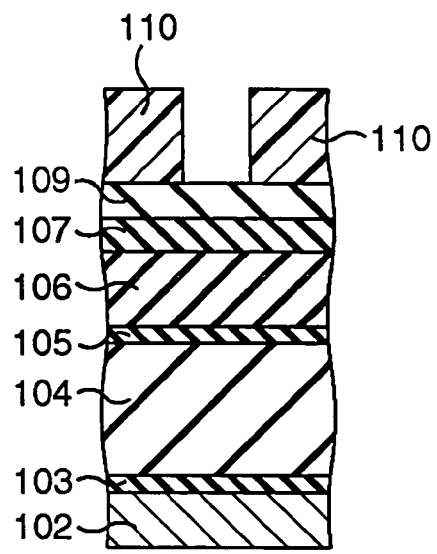
FIG. 6A to FIG. 6D are sectional views showing a method for manufacturing a semiconductor device, which adopts a conventional damascene method, step by step.
Figure 6B:
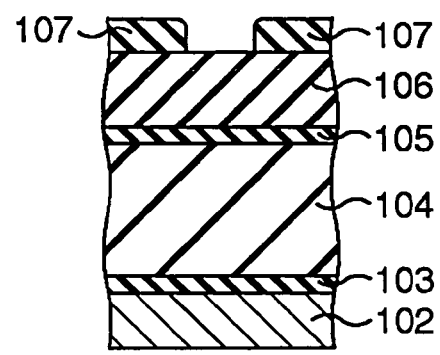
Figure 6C:
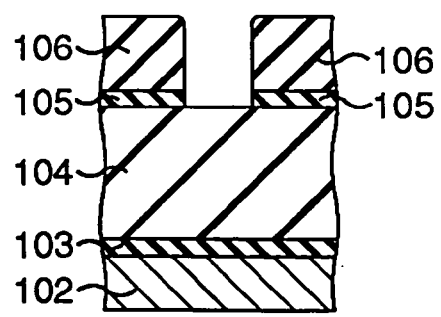
Figure 6D:
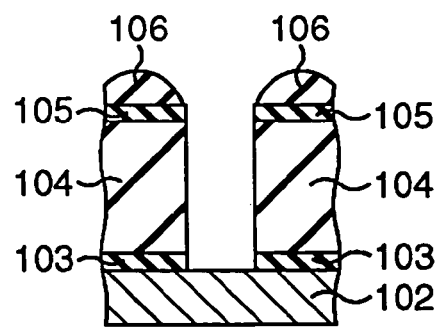
Figure 7A:
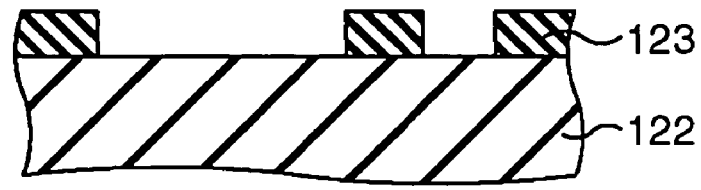
FIG. 7A to FIG. 7C are sectional view showing a method for forming a resist mask in a dual damascene method step by step.
Figure 7B:
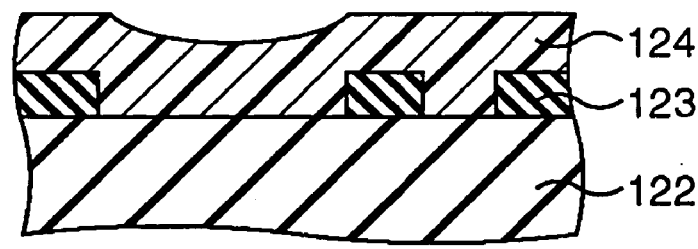
Figure 7C:
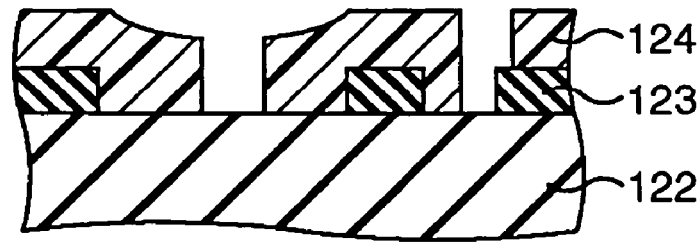

FIG. 3 is a sectional view showing the structure of the semiconductor device which is manufactured by applying the second embodiment thereto. In the example shown in FIG. 3, a multilayer wiring composed of at least two layers is formed by the manufacturing method according to the aforementioned embodiment. Moreover, a passivation film 31 made of SiN or the like is formed on the uppermost Cu wiring 27 and above the porous silica film 4. Further, a cover film composed of a SiO film 32 and a SiN film 33 is formed on the passivation film 31. An opening (not shown) for drawing out a pad as necessary is formed in the cover film.

Also in the aforementioned second embodiment, a hard mask is four-layer structured, and when the porous silica film 4 is etched, the SiC film 7, whose selection ratio to the porous silica film 4 is high, is used as a mask. Therefore, similarly to the first embodiment, deformation of the hard mask rarely occurs, which can prevent leakage caused by the deformation.

Note that a material for the interlayer insulating film is not particularly limited, and an organic low dielectric constant film may be used or a silicon oxide film may be used. Moreover, instead of the silicon carbide film, for example, a silicon nitride film may be used as the etching stopper film. Instead of the silicon carbide film, a silicon nitride film or a silicon oxynitride film may be used as the first hard mask. Instead of the silicon carbide film, a silicon nitride film may be used as the third hard mask.

For example, when the silicon carbide film (SiC film) is used as the third hard mask and the silicon nitride film (SiN film) is used as the first hard mask, the silicon nitride film can be etched at a faster speed than the silicon carbide film, whereby a reduction in the thickness of the third hard mask when the first hard mask is etched can be suppressed. Hence, it becomes possible to make the third hard mask thinner. Consequently, the etching of the third hard mask with the fourth hard mask ($SiO_2$ film) is facilitated.

As described above in detail, according to the present invention, it is possible to process the interlayer insulating film with the first to fourth hard masks and, when the opening is formed, to ensure a high selection ratio between the hard mask and the interlayer insulating film. This makes it possible to obtain a wiring with a desired shape and thereby prevent leakage between wirings caused by miniaturization.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method for manufacturing a semiconductor device having the step of forming a wiring by a damascene method, comprising the steps of:

forming an etching stopper film and an interlayer insulating film in sequence over a conductive layer;

forming a silicon carbide film, a silicon nitride film, or a silicon oxynitride film as a first hard mask over the interlayer insulating film;

forming a silicon oxide film as a second hard mask over the first hard mask;

forming a silicon carbide film or a silicon nitride film as a third hard mask over the second hard mask;

forming a silicon oxide film as a fourth hard mask over the third hard mask;

forming a pattern over the fourth hard mask;

etching the fourth hard mask by using the pattern;

etching the third hard mask by using the fourth hard mask;

etching the second hard mask by using the third hard mask;

etching the first hard mask by using the third hard mask;

forming an opening which reaches the etching stopper film in the interlayer insulating film by etching the interlayer insulating film by using the third hard mask;

etching a portion of the etching stopper film which is exposed from the opening formed in the interlayer insulating film;

and embedding a wiring material in the opening;

wherein a thickness of the third hard mask is more than twice that of the first hard mask.

2. The method for manufacturing the semiconductor device according to claim 1, wherein a low dielectric constant insulating film is used as the interlayer insulating film.

3. The method for manufacturing the semiconductor device according to claim 1, wherein an inorganic insulating film is used as the interlayer insulating film.

4. The method for manufacturing the semiconductor device according to claim 1, wherein a porous insulating film is used as the interlayer insulating film.

5. The method for manufacturing the semiconductor device according to claim 1, wherein a porous silica film is used as the interlayer insulating film.

6. The method for manufacturing the semiconductor device according to claim 1, wherein the etching stopper film is a silicon carbide film or a silicon nitride film.

7. The method for manufacturing the semiconductor device according to claim 1, wherein said step of etching the etching stopper film comprises the step of removing the third hard mask.

8. The method for manufacturing the semiconductor device according to claim 1, wherein said step of etching the second hard mask by using the third hard mask comprises the step of removing the fourth hard mask.

9. The method for manufacturing the semiconductor device according to claim 1, wherein said etching stopper film and said interlayer insulating film are formed in sequence in contact with said conductive layer; and said first hard mask is formed in contact with the interlayer insulating film.

10. A method for manufacturing a semiconductor device having the step of forming a wiring by a damascene method, comprising the steps of:

forming an etching stopper film and an interlayer insulating film in sequence in contact with a conductive layer;

forming a silicon carbide film, a silicon nitride film, or a silicon oxynitride film as a first hard mask in contact with the interlayer insulating film;

forming a silicon oxide film as a second hard mask in contact with the first hard mask;

forming a silicon carbide film or a silicon nitride film as a third hard mask in contact with the second hard mask;

forming a silicon oxide film as a fourth hard mask in contact with the third hard mask;

forming a pattern over the fourth hard mask;

etching the fourth hard mask by using the pattern;

etching the third hard mask by using the fourth hard mask;

etching the second hard mask by using the third hard mask;

etching the first hard mask by using the third hard mask;

forming an opening which reaches the etching stopper film in the interlayer insulating film by etching the interlayer insulating film, the interlayer insulating film is etched by using the third hard mask;

etching a portion of the etching stopper film which is exposed from the opening formed in the interlayer insulating film;

and embedding a wiring material in the opening.

* * * * *

UNITED STATES PATENT AND TRADEMARK OFFICE
CERTIFICATE OF CORRECTION

PATENT NO. : 7,196,003 B2  Page 1 of 1
APPLICATION NO. : 10/774496
DATED : March 27, 2007
INVENTOR(S) : Yoshihisa Iba It is certified that error appears in the above-identified patent and that said Letters Patent is hereby corrected as shown below:

On Claims

Please delete the paragraphs beginning at column 6, line 64 and column 7, line 1, and insert the following paragraph.

--The etching of $SiO_2$ film 6 is performed using the plasma etching device, for example, under the condition of 20 sccm of $C_4F_6$, 15 sccm of $O_2$, 200 sccm of Ar, 4.00 Pa (30 mTorr) of pressure, and 1500 W of RF source power.--

Signed and Sealed this

Fifteenth Day of April, 2008

JON W. DUDAS
*Director of the United States Patent and Trademark Office*